(12) United States Patent
Wang et al.

(10) Patent No.: US 10,772,222 B2
(45) Date of Patent: Sep. 8, 2020

(54) OUTDOOR CABINET AND TOP STRUCTURE THEREOF

(71) Applicant: SUNGROW POWER SUPPLY CO., LTD., Hefei Anhui (CN)

(72) Inventors: Xiaohu Wang, Hefei Anhui (CN); Rubin Wan, Hefei Anhui (CN)

(73) Assignee: SUNGROW POWER SUPPLY CO., LTD., Hefei, Anhui (CN)

( * ) Notice: Subject to any disclaimer, the term of this patent is extended or adjusted under 35 U.S.C. 154(b) by 66 days.

(21) Appl. No.: 15/985,961

(22) Filed: May 22, 2018

(65) Prior Publication Data

US 2018/0352669 A1    Dec. 6, 2018

(30) Foreign Application Priority Data

Jun. 5, 2017   (CN) .................... 2017 2 0644575 U (51) Int. Cl.
*H05K 5/00*    (2006.01)
*H05K 5/02*    (2006.01)
(Continued)

(52) U.S. Cl.
CPC ............ *H05K 5/0217* (2013.01); *H02B 1/01* (2013.01); *H02B 1/014* (2013.01); *H04Q 1/02* (2013.01);
(Continued)

(58) Field of Classification Search
CPC ............ A47B 47/0008; A47B 47/0083; A47B 47/0016; A47B 1/08; A47B 55/00;
(Continued)

(56) References Cited

U.S. PATENT DOCUMENTS 3,085,664 A * 4/1963 Adams .................... A47B 55/00
                                                            52/280
4,114,336 A * 9/1978 Bechet .................... A47B 47/02
                                                            52/280
(Continued)

FOREIGN PATENT DOCUMENTS

CN          102137553 A      7/2011
DE          19615467    *    8/1997
(Continued)

OTHER PUBLICATIONS

Indian First Examination Report; corresponding to Application No. 201814019555. dated Feb. 6, 2020.

*Primary Examiner* — Janet M Wilkens
(74) *Attorney, Agent, or Firm* — Cantor Colburn LLP (57) ABSTRACT

An outdoor cabinet and a top structure thereof are provided. The top structure of the outdoor cabinet includes a top beam, wherein the top beam is a bending plate; the number of the top beams is at least two, one of two connected top beams is provided with a first locating breach, and the other is provided with a first protruding portion in cooperation with the first locating breach for locating. Compared with that the top beam in the conventional art is a flat plate, the top structure of the outdoor cabinet provided effectively improves the strength of the top beam by designing the top beam to be the bending plate, which improves the strength of the overall top structure, reduces the influence on the hoisting of the outdoor cabinet, and improves the flexibility of the hoisting of the outdoor cabinet.

6 Claims, 6 Drawing Sheets

(51) Int. Cl.
*H05K 5/06* (2006.01)
*H04Q 1/02* (2006.01)
*H02B 1/01* (2006.01)
*H05K 7/18* (2006.01)

(52) U.S. Cl.
CPC ............... *H04Q 1/025* (2013.01); *H05K 5/06* (2013.01); *H05K 7/186* (2013.01)

(58) Field of Classification Search
CPC ...... H05K 5/0217; H05K 5/06; H05K 7/1488; H05K 5/0247; H02B 1/014; H02B 1/013; H02B 1/28; H02B 1/301; H02B 1/01; H02B 1/011
USPC ............ 312/265.1–265.6, 223.1, 296, 257.1; 211/26, 189, 182; 174/50
See application file for complete search history.

(56) References Cited

U.S. PATENT DOCUMENTS

| | | | | |
|---|---|---|---|---|
| 4,659,869 A * | 4/1987 | Busby | .................. | H05K 9/0015 174/354 |
| 4,691,970 A * | 9/1987 | Neri | .................. | A47B 47/0008 312/140 |
| 5,020,866 A * | 6/1991 | McIlwraith | .............. | H02B 1/16 312/265.4 |
| 5,202,818 A * | 4/1993 | Betsch | .................. | H02B 1/301 211/189 |
| 5,228,762 A * | 7/1993 | Mascrier | .................. | H02B 1/01 312/265.1 |
| 5,251,974 A | 10/1993 | Beals | | |
| 5,584,406 A * | 12/1996 | Besserer | .................. | F16M 1/00 211/189 |
| 6,016,634 A * | 1/2000 | Sayer | .................... | E04B 1/2403 52/648.1 |
| 6,102,498 A * | 8/2000 | Kohler | .................... | H02B 1/28 312/223.1 |
| 6,605,777 B1 * | 8/2003 | Anderson | .............. | H02B 1/301 174/50 |
| 8,091,970 B2 * | 1/2012 | Francisquini | .......... | H02B 1/301 211/192 |
| 8,292,093 B2 * | 10/2012 | Fan | ...................... | H05K 7/1488 211/26 |
| 8,292,380 B2 * | 10/2012 | Fan | ........................ | H05K 7/183 312/265.4 |
| 2003/0011289 A1 * | 1/2003 | Adams | .................. | E04B 1/3483 312/265.1 |
| 2007/0247041 A1 * | 10/2007 | Hudz | ...................... | G11B 33/02 312/265.4 |
| 2011/0050052 A1 * | 3/2011 | Elkins | ...................... | H04Q 1/09 312/223.1 |
| 2011/0181160 A1 | 7/2011 | Peng et al. | | |
| 2012/0012543 A1 * | 1/2012 | Fan | ...................... | H05K 7/1488 211/26 |
| 2013/0306584 A1 * | 11/2013 | Hofmann | ................ | H02B 1/01 211/182 |
| 2013/0342091 A1 * | 12/2013 | Walker | ................ | H05K 5/0247 312/265.5 |
| 2015/0359117 A1 * | 12/2015 | Turati | .................... | H02B 1/014 312/223.1 |
| 2016/0234953 A1 * | 8/2016 | Ellingson | ............... | H05K 5/061 |

FOREIGN PATENT DOCUMENTS

| | | | |
|---|---|---|---|
| EP | 977330 | * | 2/2000 |
| WO | 2008124910 | * | 10/2008 |
| WO | 2008124911 | * | 10/2008 |

* cited by examiner

OUTDOOR CABINET AND TOP STRUCTURE THEREOF

The present application claims the benefit of priority to Chinese Patent Application No. 201720644575.6 titled "OUTDOOR CABINET AND TOP STRUCTURE THEREOF", filed with the Chinese State Intellectual Property Office on Jun. 5, 2017, the entire disclosure of which application is incorporated herein by reference.

FIELD

The present application relates to the technical field of outdoor cabinet manufacturing, and more particularly relates to an outdoor cabinet and a top structure thereof.

BACKGROUND

An outdoor cabinet refers to a device which is made of metal or non-metallic material, exposed in the influence of the natural climate, does not allow unauthorized operators to enter an operating cabinet thereof, and provides an outdoor physical working environment and a security system for wireless communication site or wired website workstations.

At present, outdoor cabinets include outdoor assembled cabinets and outdoor integrated cabinets. For the outdoor integrated cabinet, a top structure is formed by welding top beams, and the top beam is provided with a hoisting ring for hoisting the entire outdoor cabinet. However, since the top beam is a flat plate having a small thickness, the strength of the entire top structure is low, which adversely affects the hoisting of the outdoor cabinet, thus resulting in a poor flexibility of the hoisting of the outdoor cabinet.

In addition, an inside of the outdoor integrated cabinet is not required to be sealed, and only an outside thereof is sealed integrally, so that the waterproof reliability is high. However, a volume of the outdoor integrated cabinet is limited by the processing level and the overall strength, resulting in that the outdoor integrated cabinet has a small volume and a large outdoor cabinet cannot be manufactured.

Therefore, a technical problem urgently to be addressed by those skilled in the art is to improve the strength of the top structure of the outdoor cabinet so as to improve the flexibility of the hoisting of the outdoor cabinet.

SUMMARY

In view of this, an object of the present application is provide a top structure of an outdoor cabinet, to improve the strength of the top structure, so as to improve the flexibility of the hoisting of the outdoor cabinet. Another object of the present application is to provide an outdoor cabinet having the top structure.

In order to achieve the above objects, a technical solution is provided according to the present application as follows:

a top structure of an outdoor cabinet, including top beams, wherein each of the top beam is a bending plate, the number of the top beams is at least two, and one of every two connected top beams is provided with a first locating breach, and the other is provided with a first protruding portion in a location fit with the first locating breach.

Preferably, a side configured to be seal-connected to a door plate of at least one top beam is provided with a first flanging or a second flanging, the second flanging is configured to match with a self-clamping sealing strip by clamping, and the first flanging is configured to match with a self-adhesive sealing strip by adhesion.

Preferably, a water-guiding groove is formed on the top beam by the first flanging or the second flanging.

Preferably, the top structure of the outdoor cabinet further includes a hoisting member fixed on the top beam, and the hoisting member is a corner piece.

Based on the top structure of the outdoor cabinet, an outdoor cabinet is further provided according to the present application, including an upright beam, a top structure connected to the upright beam and a top cover connected to the top structure, wherein the top structure is the top structure according to any one of the above aspects.

Preferably, the upright beam is a bending plate.

Preferably, a side, configured to be seal-connected to a first door plate, of the upright beam is provided with the first flanging or the second flanging, another side, configured to be seal-connected to a second door plate, of the upright beam is provided with the first flanging or the second flanging; the second flanging is configured to match with the self-clamping sealing strip by clamping, and the first flanging is configured to match with the self-adhesive sealing strip by adhesion.

Compared with that the top beam in the conventional art is a flat plate, the top structure of the outdoor cabinet provided according to the present application effectively improves the strength of the top beam by designing the top beam to be a bending plate, thus improves the strength of the overall top structure, reduces the influence on the hoisting of the outdoor cabinet, and improves the flexibility of the hoisting of the outdoor cabinet. And meanwhile, the locating connection of the connected two top beams is realized by the location fit of the first locating breach and the first protruding portion, which can ensure positions of the top beams without measuring, thus facilitating the installation of the top beams.

BRIEF DESCRIPTION OF THE DRAWINGS

For more clearly illustrating embodiments of the present application or the technical solutions in the conventional technology, drawings referred to describe the embodiments or the conventional technology will be briefly described hereinafter. Apparently, the drawings in the following description are only some examples of the present application, and for those skilled in the art, other drawings may be obtained based on these drawings without any creative efforts.

DETAIL DESCRIPTION

The technical solution according to the embodiments of the present application will be described clearly and completely as follows in conjunction with the accompany drawings in the embodiments of the present application. It is obvious that the described embodiments are only a part of the embodiments according to the present application, rather than all of the embodiments. All the other embodiments obtained by those skilled in the art based on the embodiments in the present application without any creative work belong to the scope of the present application.

A top structure of an outdoor cabinet according to an embodiment of the present application includes a top beam, and the top beam is a bending plate.

A specific shape of the bending plate can be designed according to actual requirements. The more bending portions of the bending plate has, the greater the strength of the bending plate is. The shape of the bending plate is not limited to the embodiment of the present application.

Compared with that the top beam in the conventional art is a flat plate, the top structure of the outdoor cabinet according to the present application effectively improves the strength of the top beam by designing the top beam to be the bending plate, thus the strength of the overall top structure is increased, the influence on the hoisting of the outdoor cabinet is decreased, and the flexibility of the hoisting of the outdoor cabinet is increased.

In the top structure of the outdoor cabinet, the strength of the top beam is improved by arranging the top beam to the bending plate, and correspondingly, a thickness of the top beam may be appropriately reduced to leave enough space for adding an air discharge structure to a top of the outdoor cabinet.

In addition, the strength improvement of the top structure of the outdoor cabinet reduces the restriction on a volume of the outdoor cabinet, which can appropriately increase the volume of the outdoor cabinet, thereby realizing the manufacturing of the large outdoor cabinet.

Preferably, a top support surface 7 of the top beam is a plane and is perpendicular to a vertical direction, that is, when the top structure of the outdoor cabinet is normally placed, the top support surface 7 is a horizontal plane, which facilitates the mounting of a top cover and waterproof arrangement.

In the top structure of the outdoor cabinet, the number of the top beam may be one, that is, the top beam is a closed annular structure. The number of the top beams may be two, and both the top beams are connected to form a closed annular structure. To facilitate the manufacture, the number of the top beams is preferably at least two. Further, in a case that the top beam is a straight beam, the number of the top beams is at least three.

In the case that the number of the top beams is at least two, in a process of connecting two top beams, positions of the top beams are required to be arranged to ensure the installation quality. In order to facilitate installation, one of every two connected top beams is provided with a first locating breach 17, and the other is provided with a first protruding portion 15 in a location fit with the first locating breach 17.

In the above structure, the locating connection of the connected two top beams is realized by the location fit of the first locating breach 17 and the first protruding portion 15, which can ensure positions of the top beams without measuring, thus facilitating the installation of the top beams.

Figure 3:
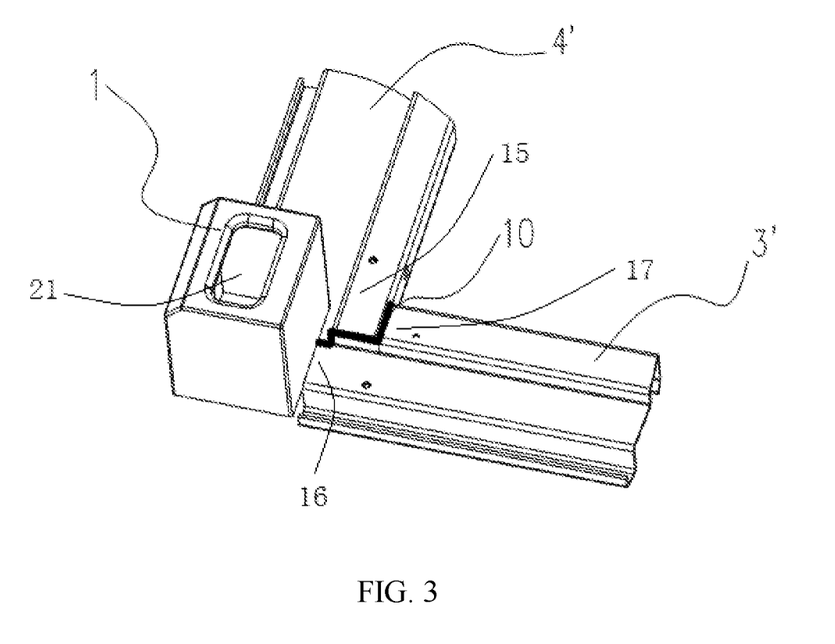
FIG. 3 is a schematic view showing a partial structure of the top structure of the outdoor cabinet according to the embodiment of the present application.
Figure 4:
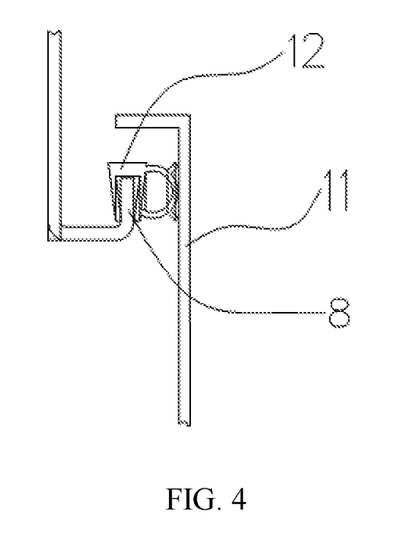
FIG. 4 is a schematic view showing the matching of a flanging and a self-clamping seal strip in a top structure of an outdoor cabinet provided according to the embodiment of the present application.
Figure 5:
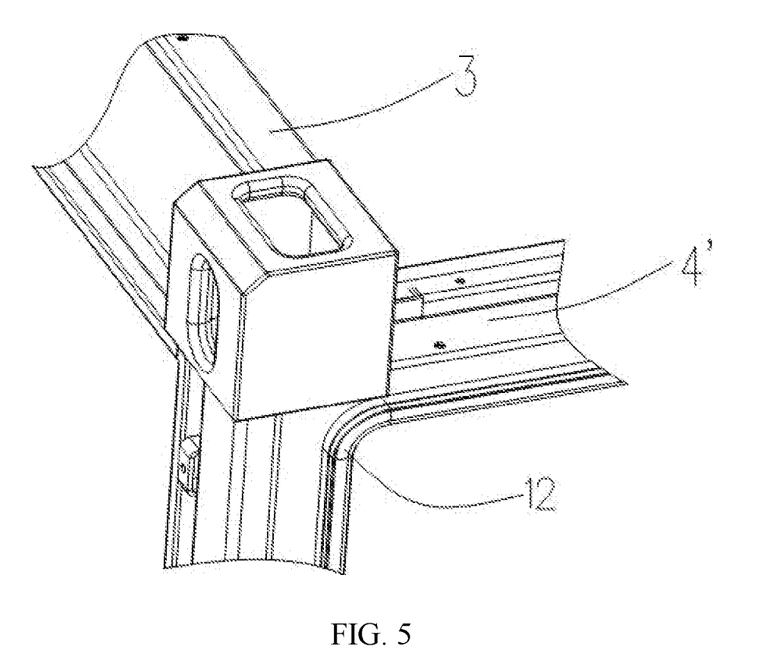
FIG. 5 is a schematic view showing the matching of a flanging and a self-adhesive seal strip in a top structure of an outdoor cabinet according to the embodiment of the present application.

Since the first locating breach 17 and the first protruding portion 15 are in a location fit with each other, the two top beams can be welded along a fit position of the first locating breach 17 and the first protruding portion 15, and since the fit position of the first locating breach 17 and the first protruding portion 15 is a bending line, a welding seam 10 can be distributed along the bending line. Specifically, the two connected top beams are fixedly connected by welding, and the welding seam 10 between the two connected top beams is distributed along the bending line, as shown in FIG. 3. Thus a welding area is increased, and the welding strength is improved, and further the connection strength of the top beams is increased, thereby improving the strength of the entire top structure.

Figure 8:
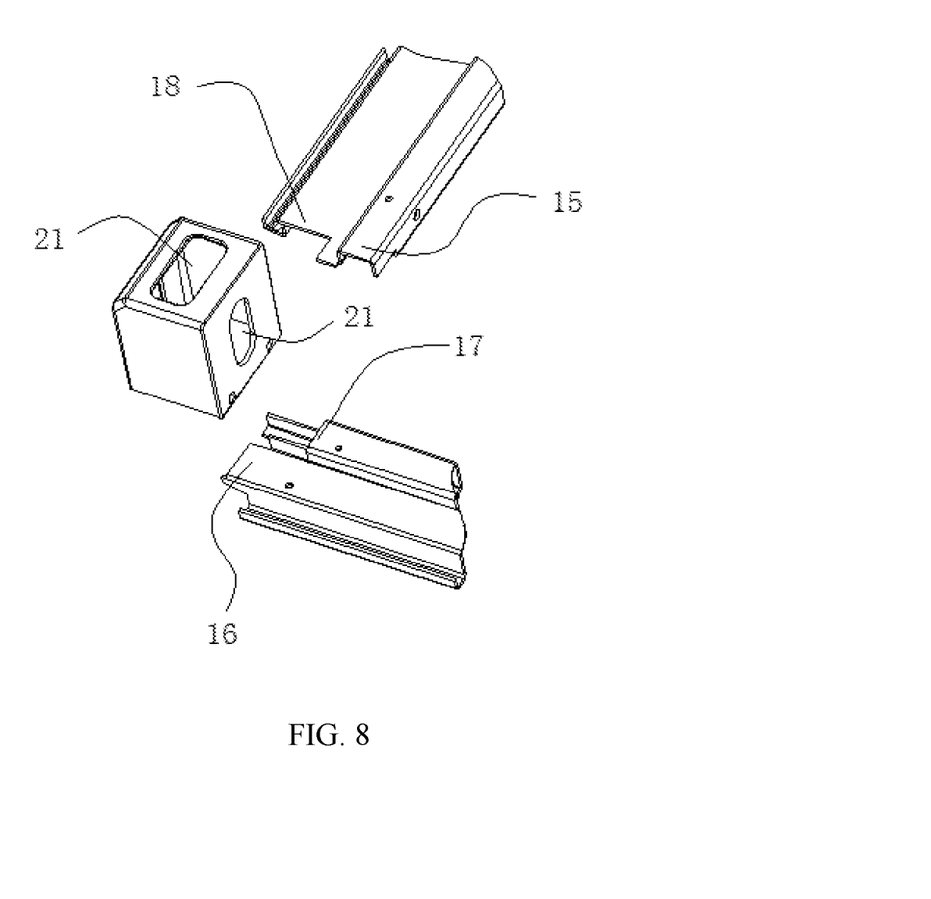
FIG. 8 is an exploded view showing the partial structure of the top structure of the outdoor cabinet in FIG. 3 according to the embodiment of the present application.

In order to improve the reliability of the locating connection, in the two connected top beams, the top beam provided with the first locating breach 17 is provided with a second protruding portion 16, and the other top beam provided with the first protruding portion 15 is provided with a second locating breach 18 in a location fit with the second protruding portion 16. Specifically, as shown in FIG. 3 and FIG. 8, a second top cross beam 3' and a second top longitudinal beam 4' are both top beams, the second top cross beam 3' is provided with the first protruding portion 15 and the second locating breach 18, and the second top longitudinal beam 4' is provided with the first locating breach 17 and the second protruding portion 16.

Shapes of the first locating breach 17, the second locating breach 18, the first protruding portion 15 and the second protruding portion 16 are designed according to actual requirements, and are not limited to the embodiment of the present application.

Preferably, the number of the top beams is four, which are respectively two top cross beams and two top longitudinal beams, the two top longitudinal beams are connected to two ends of each of the top cross beams respectively, and the two top cross beams are connected to two ends of each of the two top longitudinal beams respectively.

Specifically, the two top cross beams are a first top cross beam 3 and a second top cross beam 3' respectively, and the two longitudinal beams are a first top longitudinal beam 4 and a second top longitudinal beam 4' respectively. One end of the first top cross beam 3 is connected to one end of the first top longitudinal beam 4, and the other end of the first top cross beam 3 is connected to one end of the second top longitudinal beam 4'. One end of the second top cross beam 3' is connected to the other end of first top longitudinal beam 4, and the other end of the first top cross beam 3 is connected to the other end of the second top longitudinal beam 4'.

Preferably, the top beams are of an open structure. It should be understood that, a cross section of the top beam is not a closed annular structure.

The employment of the top beams facilitates a protection treatment of the top beams, for example, the employment of the top beams facilitates the adhesion of molding powder, is convenient for manufacture and facilitates the improvement of the protective performance of the top beams.

In the top structure of the outdoor cabinet, the top beam is required to be seal-connected to a door plate, and a sealing piece is usually a sealing strip. In a case that the door plate is more likely to be opened, the door plate is seal-connected to the top beam by employing a self-clamping sealing strip 12. In a case that the door plate is less likely to be opened, the door plate is seal-connected to the top beam by employing a self-adhesive sealing strip 14. In order to facilitate the sealing, a side of at least one top beam configured to be seal-connected to the door plate is provided with a first flanging 6 or a second flanging 8, the first flanging 6 is configured to match with the self-adhesive sealing strip 14 by adhesion, and the second flanging 8 is configured to match with the self-clamping sealing strip 12 by clamping. Besides, the above structure also increases a sealing area of the sealing strip, thereby improving the reliability of the sealing.

Preferably, the first top cross beam 3 and the second top cross beam 3' are both provided with the second flanging 8, and the first top longitudinal beam 4 and the second top longitudinal beam 4' are both provided with the first flanging 6, as shown in FIG. 1 to FIG. 5. The second top cross beam 3' is seal-connected to a first door plate 11 through the self-clamping sealing strip 12, and the self-clamping sealing strip 12 matches with the second flanging 8 by clamping. The second top longitudinal beam 4' is seal-connected to the door plate through the self-adhesive sealing strip 14, and the self-adhesive sealing strip 14 is sealed with the first flanging 6 by pressing.

Of course, each of the first top cross beam 3, the second top cross beam 3', the first top longitudinal beam 4 and the second top longitudinal beam 4' may be provided with the second flanging 8. Or each of the first top cross beam 3 and the second top cross beam 3' is provided with the first flanging 6, and each of the first top longitudinal beam 4 and the second top longitudinal beam 4' is provided with the second flanging 8. Or only the second top cross beam 3' is provided with the second flanging 8. Or only the second top cross beam 3' is provided with the first flanging 6, which is not limited to above embodiments.

Figure 1:
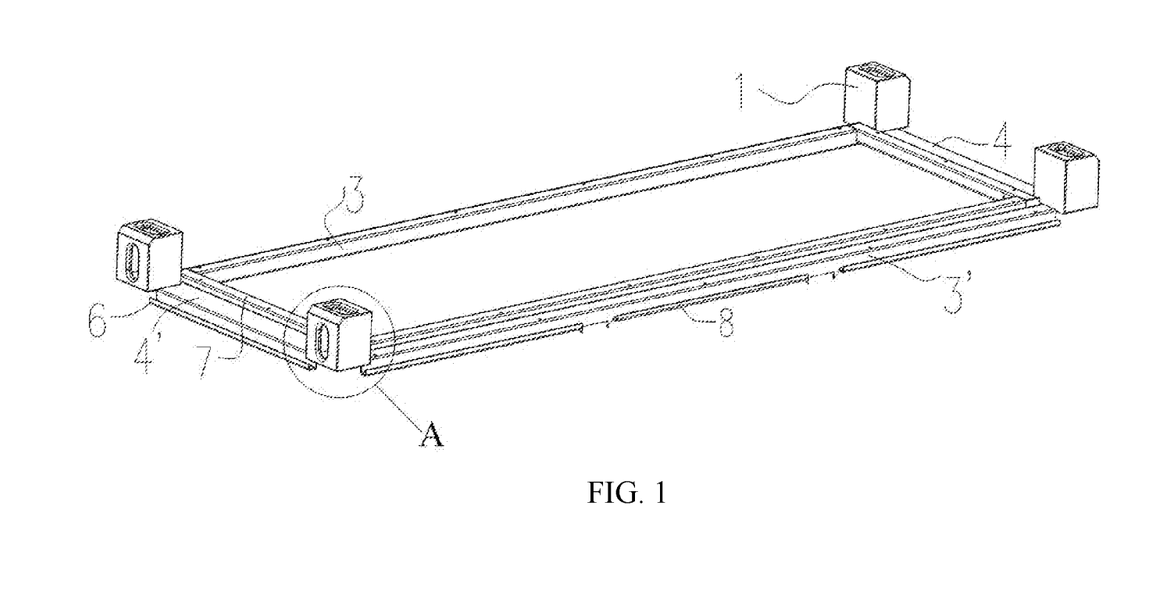
FIG. 1 is a schematic view showing the structure of a top structure of an outdoor cabinet according to an embodiment of the present application.
Figure 2:
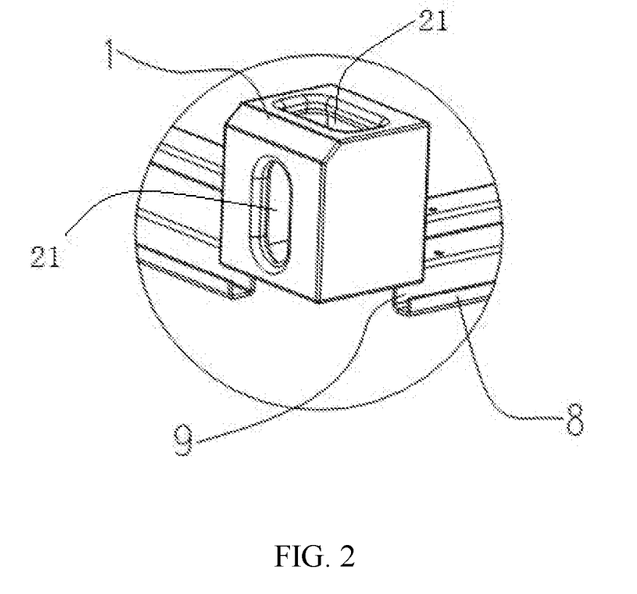
FIG. 2 is a schematic enlarged view showing the structure of portion "A" in FIG. 1.

Since the top beam is the bending plate, the top beam is apt to accumulate water. In order to discharge the accumulated water, a water-guiding groove 9 is formed on the top beam by the flanging, as shown in FIG. 2.

The water-guiding groove 9 facilitates the discharge of the accumulated water, and reduces an impact pressure applied by rainwater on the sealing strip, thereby improving the reliability of sealing.

It should be understood that, an opening of the water-guiding groove 9 faces a top end of the top structure of the outdoor cabinet. The water-guiding groove 9 may be formed on the top beam by the first flanging 6 or the second flanging 8.

In order to realize hoisting and to ensure that the top of the outdoor cabinet is detachable, the top structure of the outdoor cabinet further includes a hoisting member 1 fixed to the top beam. To facilitate the hoisting, the hoisting member 1 is a corner piece. Specifically, the corner piece has a cavity, an outer wall of the corner piece is provided with at least two through holes 21, and the through holes 21 are in communication with the cavity.

It can be seen from the structure of the corner piece that, compared with a hoisting ring, the corner piece can be directly fixed by welding, which is convenient to mount, and meanwhile facilitates water proofing. Moreover, the fixation of the corner piece is firm and reliable, which can bear a much larger force than the hoisting ring can, therefore, compared with the hoisting ring, when the hoisting outdoor cabinet with the same weight, a size of the corner piece is smaller, which correspondingly reduces the volume of the entire outdoor cabinet.

Preferably, the corner piece is rectangular solid shaped or cube shaped, which facilitates the fixation of the corner piece. Of course, the corner piece may be of other shapes, which is not limited to the above embodiments.

In order to improve the strength of the fixation of the corner piece, the corner piece is fixed on the two connected top beams. Taking the two connected top beams respectively being the second top cross beam 3' and the second top longitudinal beam 4' as an example, the corner piece is fixedly connected to the second top cross beam 3', and at the same time, the corner piece is fixedly connected to the second top longitudinal beam 4'.

The corner piece may be higher than a connecting position of the two connected top beams, or may also be lower than the connecting position of the two connected top beams, which is not limited to the embodiments of the present application.

Figure 6:
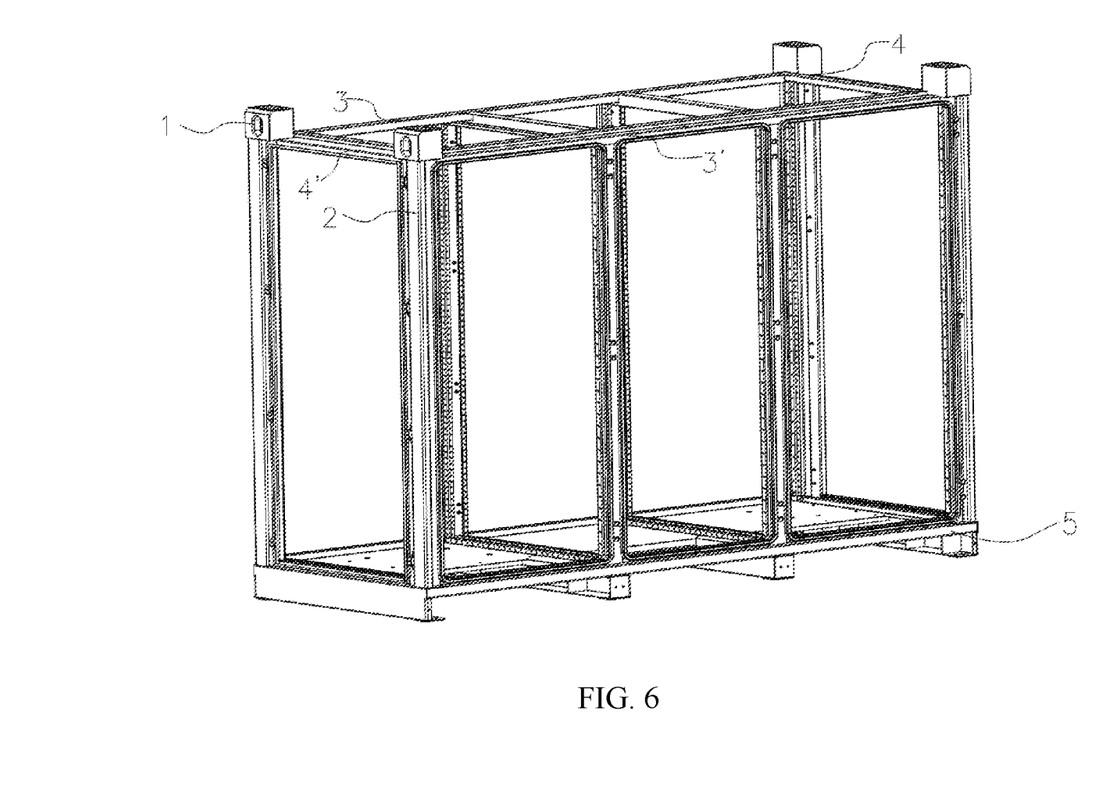
FIG. 6 is a schematic view showing the structure of the outdoor cabinet according to the embodiment of the present application.

Based on the top structure of the outdoor cabinet provided according to the above embodiments, an outdoor cabinet is further provided according to an embodiment of the present application, as shown in FIG. 6. The outdoor cabinet includes an upright beam 2, a top structure connected to the upright beam 2 and a top cover connected to the top structure, and the top structure is the top structure according to the above embodiments.

Since the top structure of the outdoor cabinet according to the embodiments has above technical effects, and the outdoor cabinet has the top structure of the outdoor cabinet, the outdoor cabinet also has above technical effects, which are not described again in the present application.

In the above outdoor cabinet, the number of the upright beams 2 is designed according to actual requirements, which is not limited in the embodiments of the present application. In the outdoor cabinet, a top end of the upright beam 2 is connected to the top structure, and a bottom end of the upright beam 2 is connected to a bottom structure 5.

The upright beam 2 may be rectangular solid shaped or be of other shapes, which is not limited by the embodiments of the present application.

Preferably, the upright beam 2 is a bending plate, which improves the supporting strength of the upright beam 2. Of course, the upright beam 2 may be of a column structure, which is not limited herein.

The upright beam 2 is required to be sealed with the door plate. In order to facilitate the sealing and improve a sealing effect, one side, seal-connected to a first door plate 11, of the upright beam 2 is provided with the first flanging 6 or the second flanging 8, and the other side, seal-connected to a second door plate 13, of the upright beam 2 is provided with the first flanging 6 or the second flanging 8. The second flanging 8 is configured to match with the self-clamping sealing strip 12 by clamping, and the first flanging 6 is configured to match with the self-adhesive sealing strip 14 by adhesion.

Figure 7:
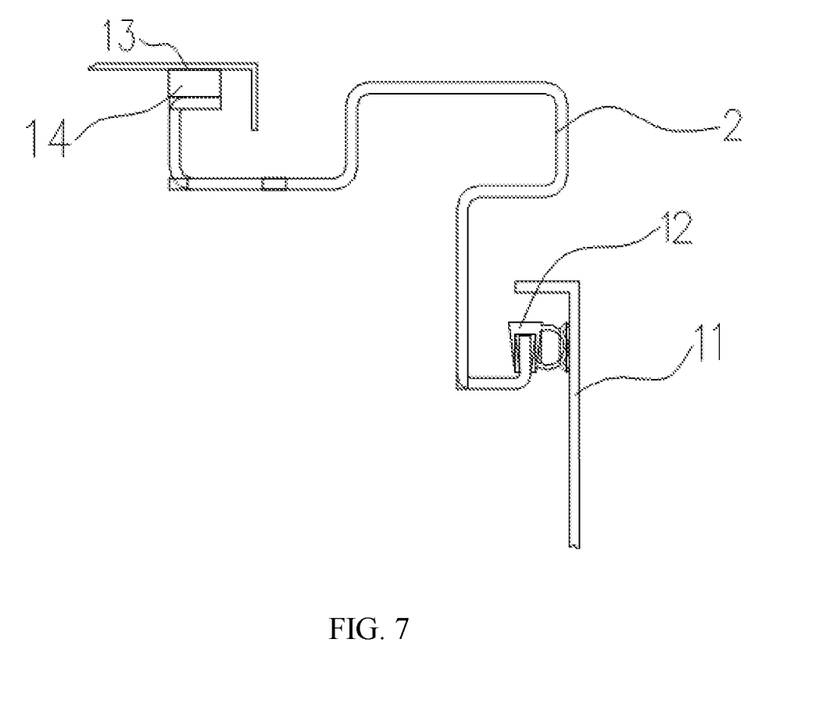
FIG. 7 is a schematic view showing the sealing between an upright beam and door plates in the outdoor cabinet according to the embodiment of the present application.

Further, one side, seal-connected to the first door plate 11, of the upright beam 2 is provided with the second flanging 8, and the other side, seal-connected to the second door plate 13, of the upright beam 2 is provided with the first flanging 6, which indicates that, the self-clamping sealing strip 12 is mounted on the upright beam 2 through the second flanging 8, that is, the upright beam 2 and the first door plate 11 are seal-connected through the self-clamping sealing strip 12; the self-adhesive sealing strip 14 is mounted on the upright beam 2 through the first flanging 6, that is, the upright beam 2 and the second door plate 13 are seal-connected through the self-adhesive sealing strip 14, as shown in FIG. 7.

Based on the above description of the disclosed embodiments, the person skilled in the art is capable of carrying out or using the present application. It is obvious for the person skilled in the art to make many modifications to these embodiments. The general principle defined herein may be applied to other embodiments without departing from the spirit or scope of the present application. Therefore, the present application is not limited to the embodiments illustrated herein, but should be defined by the broadest scope consistent with the principle and novel features disclosed herein.

What is claimed is:

1. A top structure of an outdoor cabinet, comprising top beams, wherein each of the top beams is a bending plate, the number of the top beams is at least two, and one of every two connected top beams is provided with a first locating breach and the other is provided with a first protruding portion in a location fit with the first locating breach; and the top structure of the outdoor cabinet further comprises a hoisting member fixed on the top beam and configured to hoist the top structure of the outdoor cabinet, wherein the hoisting member is a corner piece, the corner piece has a cavity, an outer wall of the corner piece is provided with at least two through holes, and the through holes are in communication with the cavity.

2. The top structure according to claim 1, wherein a side, configured to be seal-connected to a door plate, of at least one top beam is provided with a first flanging or a second flanging, the second flanging is configured to match with a self-clamping sealing strip by clamping, and the first flanging is configured to match with a self-adhesive sealing strip by adhesion.

3. The top structure according to claim 2, wherein a water-guiding groove is formed on the top beam by the first flanging or the second flanging.

4. An outdoor cabinet, comprising an upright beam, a top structure connected to the upright beam and a top cover connected to the top structure, wherein the top structure is the top structure according to claim 1.

5. The outdoor cabinet according to claim 4, wherein the upright beam is a bending plate.

6. The outdoor cabinet according to claim 5, wherein one side, configured to be seal-connected to a first door plate, of the upright beam is provided with a first flanging or a second flanging, and another side, configured to be seal-connected to a second door plate, of the upright beam is provided with the first flanging or the second flanging; and The second flanging is configured to match with a self-clamping sealing strip by clamping, and the first flanging is configured to match with a self-adhesive sealing strip by adhesion.

\* \* \* \* \*